(12) United States Patent
Sakata

(10) Patent No.: US 6,790,761 B2
(45) Date of Patent: Sep. 14, 2004

(54) METHOD OF FABRICATING A SEMICONDUCTOR DEVICE

(75) Inventor: Toyokazu Sakata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/339,454

(22) Filed: Jan. 10, 2003

(65) Prior Publication Data

US 2003/0170974 A1 Sep. 11, 2003

(30) Foreign Application Priority Data

Mar. 7, 2002 (JP) ........................................ 2002-061635

(51) Int. Cl.[7] .......................................... H01L 21/4763
(52) U.S. Cl. ...................................... 438/619; 438/725
(58) Field of Search ................................ 438/619, 618, 438/637, 672, FOR 355

(56) References Cited

U.S. PATENT DOCUMENTS

| | | | | | |
|---|---|---|---|---|---|
| 5,547,892 | A | * | 8/1996 | Wuu et al. | 438/152 |
| 5,970,376 | A | * | 10/1999 | Chen | 438/637 |
| 6,265,321 | B1 | * | 7/2001 | Chooi et al. | 438/725 |
| 6,312,994 | B1 | * | 11/2001 | Nakamura | 438/279 |
| 6,333,255 | B1 | * | 12/2001 | Sekiguchi | 438/622 |
| 6,346,484 | B1 | * | 2/2002 | Cotte et al. | 438/725 |
| 6,476,492 | B2 | * | 11/2002 | Iwasaki et al. | 257/758 |
| 6,531,389 | B1 | * | 3/2003 | Shue et al. | 438/637 |
| 6,541,358 | B2 | * | 4/2003 | Watanabe | 438/533 |
| 6,577,011 | B1 | * | 6/2003 | Buchwalter et al. | 257/758 |
| 2001/0005628 | A1 | * | 6/2001 | Inoue et al. | 438/637 |
| 2001/0045651 | A1 | * | 11/2001 | Saito et al. | 257/750 |
| 2002/0064934 | A1 | * | 5/2002 | Deboer et al. | 438/622 |

FOREIGN PATENT DOCUMENTS

| | | | | |
|---|---|---|---|---|
| EP | 599317 A1 | * | 6/1994 | ........... H01L/21/90 |
| JP | 07-045701 | | 2/1995 | |
| JP | 09-172068 | | 6/1997 | |
| JP | 11-243145 | | 9/1999 | |
| JP | 2002-184859 | | 6/2002 | |

* cited by examiner

Primary Examiner—W. David Coleman
(74) Attorney, Agent, or Firm—Volentine Francos, PLLC

(57) ABSTRACT

A semiconductor device having conductive paths separated by cavities is formed by depositing organic spin-on glass between the conductive paths, forming gaps between the organic spin-on glass and the conductive paths, and then removing the organic spin-on glass through the gaps. The gaps may be formed as a dummy pattern of via holes that are misaligned with the conductive paths, so that they extend past the upper surfaces of the conductive paths and form fine slits beside the conductive paths. This method of removing the spin-on glass leaves cavities that are free of unwanted oxide residue and debris, thereby minimizing the capacitive coupling between adjacent conductive paths.

21 Claims, 9 Drawing Sheets

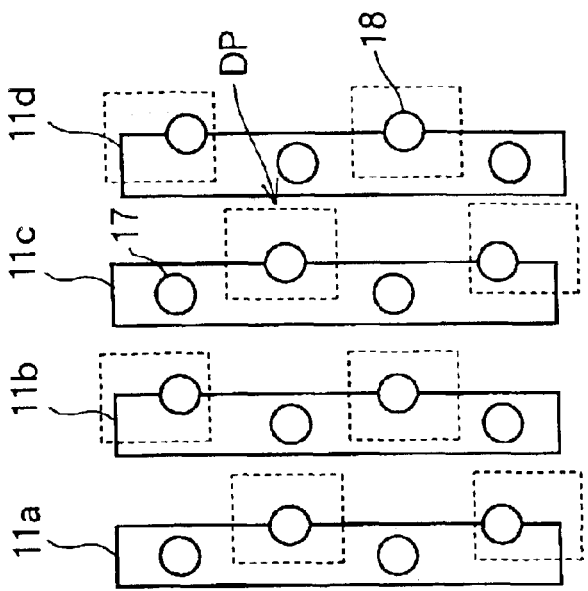
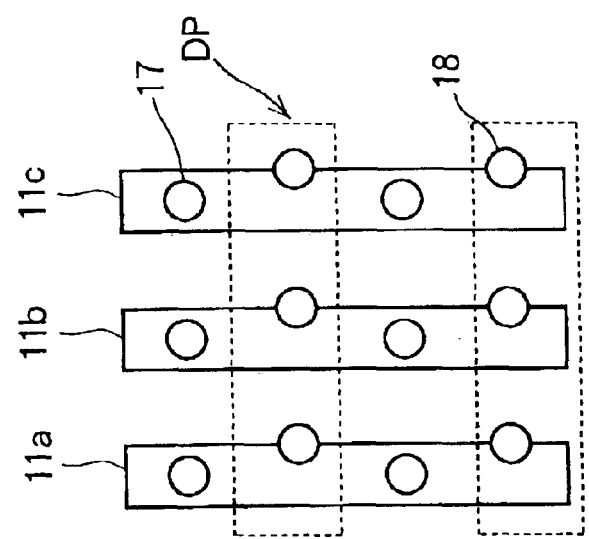
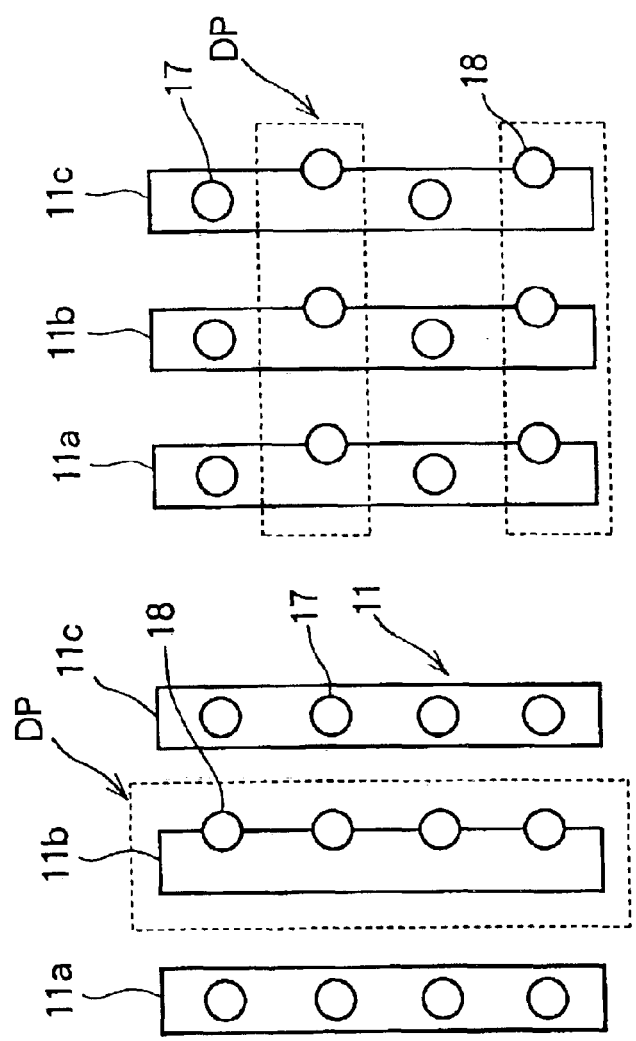

METHOD OF FABRICATING A SEMICONDUCTOR DEVICE

BACKGROUND OF THE INVENTION

1. Field of the Invention

The present invention relates to a method of fabricating a semiconductor device having one or more layers of conductive paths, and more particularly to a method of fabricating a semiconductor device in which a gas, such as air, of low permittivity is trapped in cavities between adjacent conductive paths.

2. Description of the Related Art

Capacitive coupling between mutually adjacent conductive paths in a semiconductor device causes crosstalk and limits the operating speed of the device. A known method of mitigating these problems is to form cavities between the conductive paths and fill the cavities with a low-permittivity material such as air, thereby reducing the capacitive coupling ratio. Conventionally, this is done by covering the conductive paths and the spaces between them with a layer of organic spin-on glass capped by an oxide layer, opening pinholes in the oxide cap layer, removing the spin-on glass through the pinholes by a dry etching process, and sealing the cavities by filling in the pinholes with oxide plugs.

Unfortunately, this conventional process tends to leave an oxide residue inside the cavities. In the worst case, the oxide plugs may fall into the cavities, which then become clogged with oxide debris and with other debris and residue from subsequent fabrication processes. As a result, the cavities are inadequately filled with air, their dielectric characteristics are altered, and the original purpose of forming the cavities is not wholly achieved.

SUMMARY OF THE INVENTION

An object of the present invention is to provide a semiconductor device fabrication method that can consistently achieve a desired reduction in the capacitive coupling between adjacent conductive paths.

In the invented method of fabricating a semiconductor device, a plurality of conductive paths, separated by organic spin-on glass, are formed on a semiconductor substrate. Then gaps are formed between the organic spin-on glass and the conductive paths, and the organic spin-on glass is removed through the gaps.

Removal of the spin-on glass through the gaps, which may take the form of fine slits disposed beside the conductive paths, leaves cavities that are substantially free of unwanted residues and debris. The capacitive coupling between adjacent conductive paths is consistently lowered, because the cavities are filled with a low-permittivity material, such as air, which has minimal permittivity.

BRIEF DESCRIPTION OF THE DRAWINGS

In the attached drawings:

FIGS. 2A, 2B, and 2C illustrate patterns of gaps for removing the spin-on glass in the first inventive method;

DETAILED DESCRIPTION OF THE INVENTION

Figure 1A:
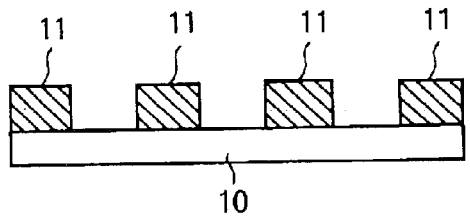
FIGS. 1A, 1B, 1C, 1D, 1E, 1F, 1G, and 1H are sectional views illustrating the fabrication of a semiconductor device by a first inventive method.

Embodiments of the invention will now be described with reference to the attached drawings, in which like elements are indicated by like reference characters.

First Embodiment

FIGS. 1A to 1H show sectional views of a semiconductor device at various stages of fabrication by a first method embodying the invention.

First, as shown in FIG. 1A, a conductive film is formed on a semiconductor substrate 10, and patterned to create a lower layer of conductive paths 11.

Figure 1E:
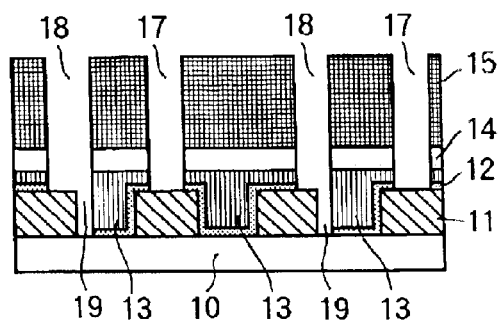
Figure 1B:
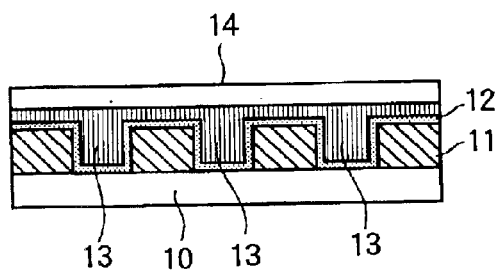

Next, as shown in FIG. 1B, a silicon dioxide ($SiO_2$) film 12 is formed on the semiconductor substrate 10 and conductive paths 11, in close contact therewith, and a layer of organic spin-on glass (SOG) 13 is deposited on the $SiO_2$ film 12. An oxide cap 14 is then formed over the organic spin-on glass layer 13.

Figure 1F:
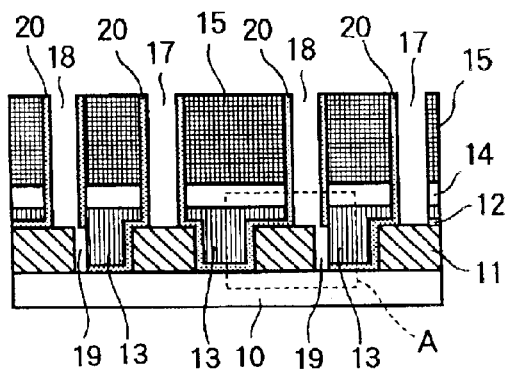
Figure 1C:
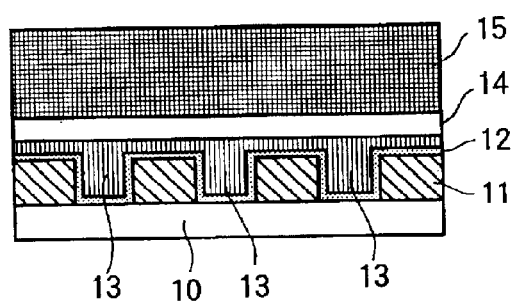

Next, as shown in FIG. 1C, an interlayer dielectric film 15, such as an $SiO_2$ film or a silicon nitride ($Si_3N_4$) film, is formed over the oxide cap 14.

Figure 1G:
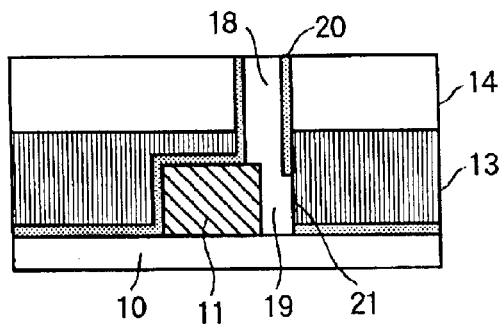
Figure 1D:
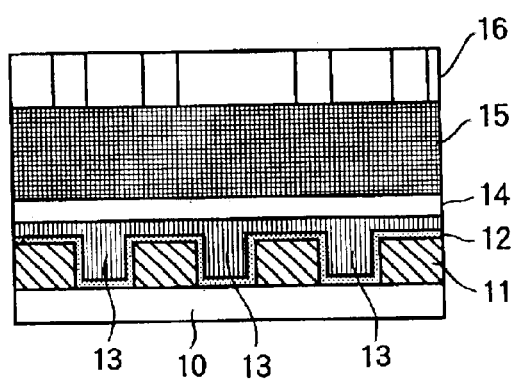

Next, as shown in FIG. 1D, the interlayer dielectric film 15 is coated with a photoresist 16, and the photoresist 16 is patterned to define via holes 17 and gaps 18 (shown in FIG. 1E).

Next, as shown in FIG. 1E, the interlayer dielectric film 15, oxide cap 14, organic spin-on glass layer 13, and $SiO_2$ film 12 are etched with the patterned photoresist 16 employed as a mask, thereby forming the via holes 17 and gaps 18. After the via holes 17 and gaps 18 have been formed, the photoresist 16 is removed.

As shown in FIG. 1E, the via holes 17 are ordinary via holes that can be filled with a conductive material to conduct current between the conductive paths 11 and an upper layer of conductive paths. The gaps 18 are dummy via holes formed at the same time as the via holes 17, but for the purpose of removing the organic spin-on glass 13 later.

The device is designed so that, as shown in FIG. 1E, the gaps 18 are misaligned with the conductive paths 11 in the lower layer. Formation of a gap 18 creates an extremely fine slit 19 beside a conductive path 11. The width of the slit 19 is 0.1 to 0.2 micrometer, for example.

Next, as shown in FIGS. 1F and 1G, a layer of barrier metal 20 such as a titanium nitride (TiN) layer is deposited on the internal surfaces of the via holes 17 and the gaps 18 preparatory to the formation of conductive plugs. FIG. 1G is a magnified view of the region A surrounding one of the slits 19 in FIG. 1F.

As shown in FIG. 1G, a side face 21 of the organic spin-on glass layer 13 is left exposed in the slit 19. The reason why the side face 21 is not covered by the layer of barrier metal 20 is thought to be that the slit 19 is too fine to permit entry of the molecules and atoms forming the barrier metal 20.

Figure 1H:
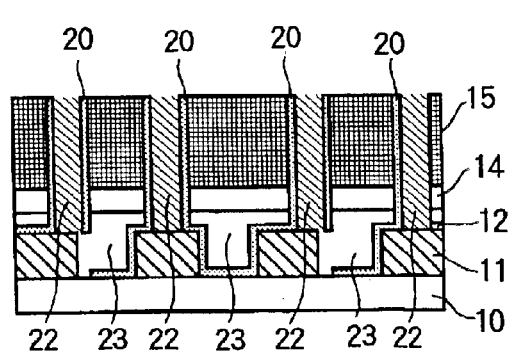

Next, as shown in FIG. 1H, the via holes 17 and gaps 18 are filled in with conductive plugs 22. The conductive plugs 22 are deposited from a gas which is introduced into the via holes 17 and gaps 18. The plugs may be made of tungsten, for example, in which case the gas has tungsten hexafluoride ($WF_6$), for example, as its main component. The gas also enters the slits 19 and rapidly etches the exposed faces 21 of the organic spin-on glass 13. By the time the conductive plugs 22 have been formed, substantially all of the organic spin-on glass 13 has been etched and removed through the slits 19 and gaps 18, leaving cavities 23 in the spaces where the organic spin-on glass 13 was present. When the gaps 18 are completely filled in by the conductive plugs 22, a material of low permittivity, namely air, is trapped within the cavities 23.

As shown in FIG. 1H, the oxide cap 14 and the interlayer dielectric film 15 located above the cavities 23 make close contact (through the layer of barrier metal 20) with the conductive plugs 22 filling the via holes 17 and gaps 18, and are securely supported by the conductive plugs 22.

Next, an upper layer of conductive paths is formed on the conductive plugs 22 by the same process as in FIG. 1A, and the processes in FIGS. 1B to 1H are repeated to form a second layer of conductive paths separated by cavities. Additional layers can be formed by further repetitions of the processes in FIGS. 1A to 1H.

FIGS. 2A to 2C show patterns of gaps 18 for removing the organic spin-on glass 13 from various interlayer regions. From the standpoints of interlayer strength and efficient removal of the filling material, various gap patterns can be conceived, but their basic feature is that the gaps 18 for removing the organic spin-on glass 13 are intermingled with the via holes 17 that electrically interconnect the upper and lower layers of conductive paths 11, as shown in FIGS. 2A to 2C. The reference numerals in FIGS. 2A to 2C correspond to the reference numerals in FIGS. 1A to 1H, with conductive paths 11a, 11b, 11c, and 11d disposed in the lower layer, corresponding to conductive paths 11 in FIGS. 1A to 1H. Gap patterns (dummy patterns) are denoted DP.

In the gap pattern illustrated in FIG. 2A, among the adjacent conductive paths 11a, 11b, and 11c, via holes 17 are formed only on conductive paths 11a and 11c, and gaps 18 are formed only on the conductive path 11b disposed between conductive paths 11a and 11c. In other words, a gap pattern DP is formed on conductive path 11b, but not on the surrounding conductive paths 11a and 11c. The gap pattern DP is thus oriented parallel to the routing direction of the conductive paths 11a, 11b, and 11c.

In the gap pattern arrangements in FIGS. 2B and 2C, via holes 17 and gaps 18 alternate on each of the conductive paths 11a, 11b, and 11c.

In FIG. 2B, the via holes 17 and gaps 18 are formed so that on the adjacent conductive paths 11a and 11b, the via holes 17 face each other, and the gaps 18 face each other. This arrangement also applies to the adjacent conductive paths 11b and 11c. The gap patterns DP are oriented perpendicular to the routing directions of the conductive paths 11a, 11b, and 11c.

In FIG. 2C, the via holes 17 and gaps 18 are formed on the adjacent conductive paths 11a and 11b so that the via holes 17 on conductive path 11a face the gaps 18 on conductive path 11b, and the gaps 18 on conductive path 11a face the via holes 17 on conductive path 11b. This arrangement also applies to the adjacent conductive paths 11b and 11c, and the adjacent conductive paths 11c and 11d. The gap patterns DP are thus disposed in a checkerboard arrangement.

As described above, in the first embodiment, the gaps 18 for removing the organic spin-on glass 13 are formed in positions that are misaligned with the conductive paths 11 in the lower layer. Fine slits 19 are thereby created beside the conductive paths 11, and side faces 21 of the organic spin-on glass layer 13, not covered by the barrier metal 20, are left exposed in the slits 19. Since the exposed faces 21 of the organic spin-on glass layer 13 are etched by direct exposure to the gas employed for formation of the conductive plugs 22 ($WF_6$ gas for tungsten conductive plugs 22), the organic spin-on glass 13 can be removed while the conductive plugs 22 are being formed.

Figure 3:
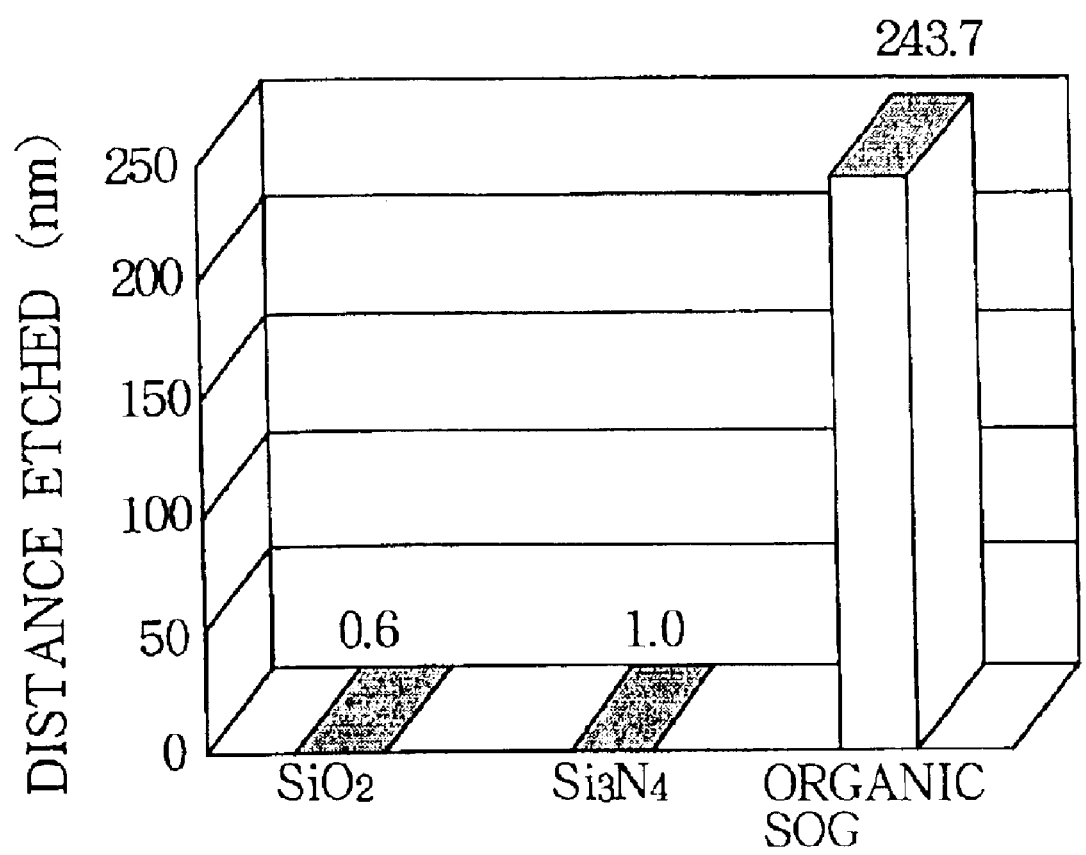
FIG. 3 is a graph illustrating rates of etching by tungsten hexafluoride gas.

Evidence that the organic spin-on glass 13 can be removed at the time of formation of the conductive plugs 22 will be presented with reference to the graph in FIG. 3. This graph shows the amount of etching of the organic spin-on glass film per minute by $WF_6$ gas, which is the principal gas used in the formation of tungsten conductive plugs 22, together with the etching amounts of $SiO_2$ and $Si_3N_4$ films per minute by $WF_6$ gas.

As shown in FIG. 3, while the $SiO_2$ and $Si_3N_4$ films are respectively etched by one nanometer (1 nm), the organic spin-on glass film is etched by 250 nm. Accordingly, when $WF_6$ gas attacks the exposed spin-on glass faces 21 of the slits 19 in the gaps 18 during the formation of the tungsten conductive plugs 22, the organic spin-on glass 13 is fully etched and removed before the interlayer dielectric film 15 comprising $SiO_2$ or $Si_3N_4$ has been etched to any appreciable extent. Selective removal of the organic spin-on glass 13 is thus achieved: the spin-on glass 13 is removed substantially alone.

In the first embodiment, since the gaps 18 and slits 19 are formed simultaneously with the via holes 17, and since the organic spin-on glass 13 is etched by the same gas from which the conductive plugs 22 are deposited and is removed while the conductive plugs 22 are being formed, no additional processes are needed to create the cavities 23. The first embodiment enables the invention to be practiced at substantially no additional cost to the semiconductor device manufacturer.

A further advantage of the first embodiment is that no oxide residue or debris is left in the cavities 23. In particular, the oxide cap 14 and interlayer dielectric film 15 forming the roof of the cavities 23 cannot fall in, because they are securely supported by the conductive plugs 22 in the via holes 17 and gaps 18. Nor can debris enter the cavities 23 through the slits 19, because of their narrow width. The cavities 23 are left filled with a low-permittivity gas, or air. The first embodiment achieves maximum benefit from the low permittivity and can consistently reduce the capacitive coupling between adjacent conductive paths. In a device with multi-layer wiring, this applies both to adjacent conductive paths in adjacent layers and adjacent conductive paths in the same layer.

Second Embodiment

FIGS. 4A to 4I show sectional views of a semiconductor device at various stages of fabrication by a second method according to the invention, using the same reference numerals as in FIGS. 1A to 1H for similar components and elements.

Figure 4A:
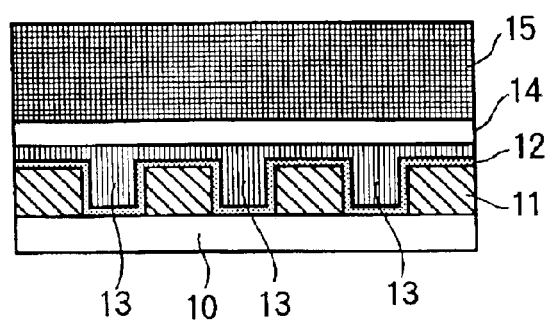
FIGS. 4A, 4B, 4C, 4D, 4E, 4F, 4G, 4H, and 4I are sectional views illustrating the fabrication of a semiconductor device by a second inventive method.

First, as shown in FIG. 4A, a lower layer of the conductive paths 11, an $SiO_2$ film 12, a layer of the organic spin-on glass 13, an oxide cap 14, and an interlayer dielectric film 15 are formed on a semiconductor substrate 10 by the same processes as in FIGS. 1A to 1C.

Figure 4B:
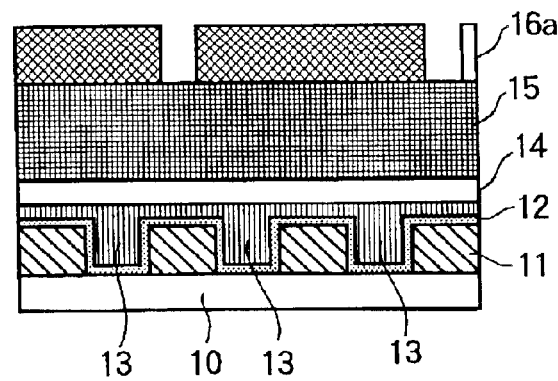
Figure 4C:
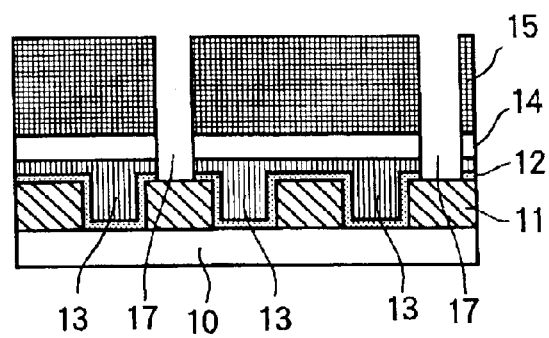

Next, as shown in FIG. 4B, the interlayer dielectric film 15 is coated with a photoresist 16a, and the photoresist 16a is patterned to define via holes 17 (shown in FIG. 4C).

Next, as shown in FIG. 4C, the interlayer dielectric film 15, oxide cap 14, layer of organic spin-on glass 13, and $SiO_2$ film 12 are etched with the patterned photoresist 16a employed as a mask, thereby forming the via holes 17. After the via holes 17 have been formed, the photoresist 16a is removed.

Figure 4D:
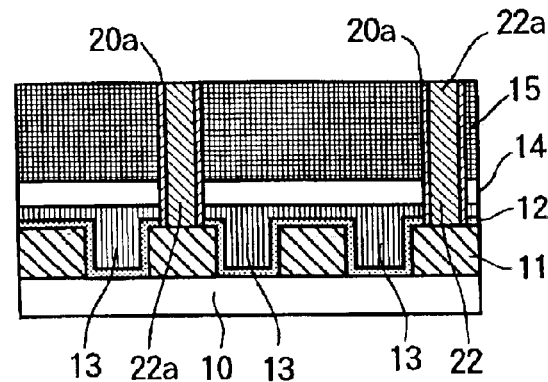

Next, as shown in FIG. 4D, a layer of barrier metal 20a such as TiN is deposited on the internal surfaces of the via holes 17 preparatory to the formation of conductive plugs. Conductive plugs 22a made of a metal such as tungsten are then deposited in the via holes 17.

Figure 4E:
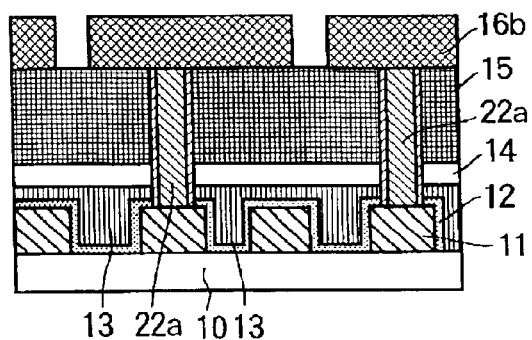
Figure 4F:
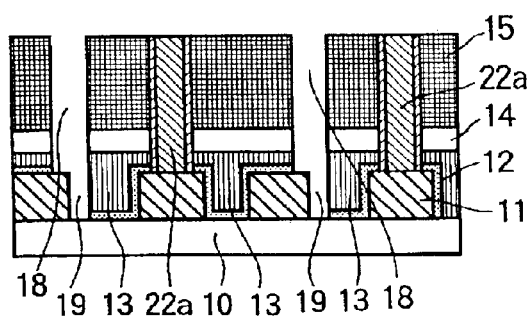

Next, as shown in FIG. 4E, the interlayer dielectric film 15 is coated with another photoresist 16b, and the photoresist 16b is patterned to define gaps 18 (shown in FIG. 4F).

Next, as shown in FIG. 4F, the interlayer dielectric film 15, oxide cap 14, layer of the organic spin-on glass 13, and $SiO_2$ film 12 are dry etched to form the gaps 18. Formation of a gap 18 creates an extremely fine slit 19 beside a conductive path 11, as described in the first embodiment.

Figure 4G:
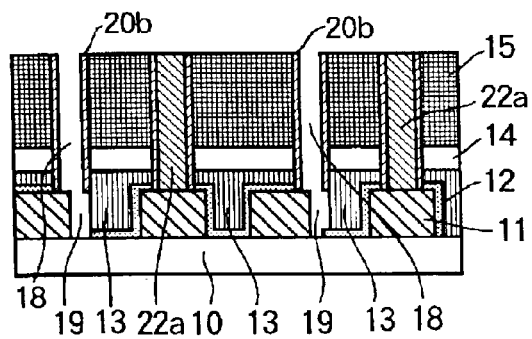
Figure 4H:
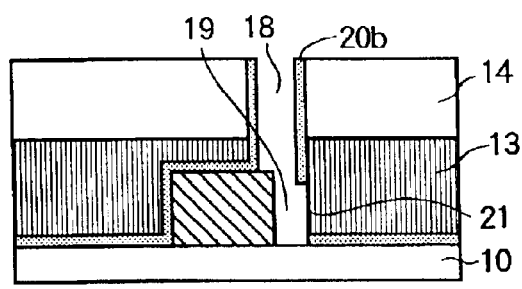

Next, as shown in FIGS. 4G and 4H, a layer of barrier metal 20b is deposited on the internal side surfaces of the gaps 18. FIG. 4H is a magnified view of the region surrounding one of the slits 19 in FIG. 4G. As in the first embodiment, an exposed face 21 of organic spin-on glass 13, not covered by the layer of barrier metal 20b, is left in each slit 19. The barrier metal 20b may be made of the same material as the barrier metal 20a, or a different material may be employed; a material that does not enter the slits 19 should be selected, so that an exposed organic spin-on glass face 21 is left in the slits 19.

Figure 4I:
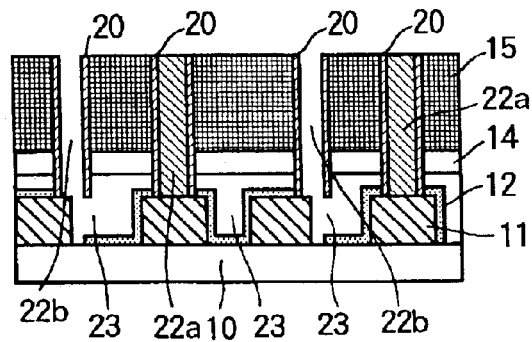

Next, as shown in FIG. 4I, the organic spin-on glass 13 is removed by dry etching, thereby forming cavities 23 in the spaces where the organic spin-on glass 13 was present. During the removal of the organic spin-on glass 13, the exposed faces 21 of the organic spin-on glass 13 are frontally attacked by the etching gas, and the organic spin-on glass 13 is removed from the exposed faces 21 through the gaps 18.

Since the gaps 18 are used only for removing the organic spin-on glass 13, and are not used for electrically interconnecting upper and lower layers of conductive paths 11, the gaps 18 do not necessarily have to be filled in by conductive plugs. They can be left empty, as illustrated in FIG. 4I, which facilitates removal of the etched organic spin-on glass material, and subsequent filling of the cavities 23 with air.

Regardless of whether conductive plugs are formed in the gaps 18 or not, any gas that can selectively etch the organic spin-on glass 13 can be employed as the etching gas. In particular, the same gas as used for forming the conductive plugs 22a (e.g., a gas mainly comprising $WF_6$) may be used. Alternatively, a different gas may be employed. If dummy conductive plugs are formed in the gaps 18, the same material as that of the conductive plugs 22a can be employed, or a different material may be employed.

As shown in FIG. 4I, the oxide cap 14 and the interlayer dielectric film 15 located over the cavities 23 make close contact (through the layer of the barrier metal 20) with the conductive plugs 22a filling the via holes 17, or the conductive plugs 22a filling the via holes 17 and the dummy conductive plugs filled into the gaps 18. The oxide cap 14 and interlayer dielectric film 15 are thus supported by the conductive plugs 22a, or the conductive plugs 22a and the dummy conductive plugs.

Next, an upper layer of conductive paths is formed on the conductive plugs 22a, or the conductive plugs 22a and the dummy conductive plugs, by the same process as in FIG. 1A in the first embodiment. After the process shown in FIG. 4I, all of the processes shown in FIG. 4A to FIG. 4I are repeated to form multi-layer wiring.

When conductive plugs are not formed in the gaps 18 after removal of the organic spin-on glass 13, the spaces 22b in the gaps 18 are left as cavities, as illustrated in FIG. 4I. These cavities 22b are sealed when the next upper layer of conductive paths and their oxide cap are formed, so that air is trapped in both these cavities 22b and the cavities 23 left by removal of the spin-on glass 13.

As described above, in the second embodiment, the formation of the via holes 17 used for electrical conduction between the upper and lower layers of conductive paths 11 and the formation of the gaps 18 used for removal of the organic spin-on glass 13 are performed as separate steps. Furthermore, the formation of conductive plugs 22a in the via holes 17 and the removal of the organic spin-on glass 13 from the exposed faces 21 of the organic spin-on glass 13 are performed separately.

In the first embodiment, the via holes 17 and gaps 18 are formed simultaneously, and the organic spin-on glass 13 is removed while the conductive plugs 22 are being formed. Accordingly, the gas that etches the organic spin-on glass layer 13 must be the same as the gas from which the conductive plugs 22 are formed, and the organic spin-on glass layer 13 must be formed of a material that can be etched by this gas.

In contrast, in the second embodiment, the organic spin-on glass 13 is removed in a process independent of the process that forms the conductive plugs 22a, so the gas used for removing the organic spin-on glass 13 does not need to be the same as the gas used for forming the conductive plugs 22a. Similarly, the organic spin-on glass 13 does not need to be formed of a material that can be etched by the gas used for forming the conductive plugs 22a. Accordingly, the second embodiment allows more types of organic spin-on glass to be employed, and allows various types of etching gas suitable for selective etching of the organic spin-on glass to be employed.

In the second embodiment, as in the first embodiment, extremely fine slits 19 are formed beside the conductive paths 11, and organic spin-on glass material is removed from exposed side faces of the organic spin-on glass layer 13. Thus, much less residue is left in the cavities 23 than was left in the prior art, particularly if the spaces 22b in the gaps 18 are left empty. Maximum benefit of the minimal permittivity of air is achieved, and the capacitive coupling between adjacent conductive paths in adjacent layers or the same layer is consistently reduced by a large amount.

The first two embodiments can be compared as follows with the prior art.

FIGS. 5A to 5K illustrate a conventional fabrication process for a semiconductor device, as described in, for example, Japanese Unexamined Patent Application Publication No. 11-24315.

Figure 5A:
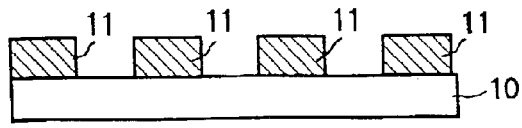
FIGS. 5A, 5B, 5C, 5D, 5E, 5F, 5G, 5H, 5I, 5J, and 5K are sectional views illustrating the fabrication of a semiconductor device by a prior-art method.

First, as shown in FIG. 5a, a conductive film is formed on a semiconductor substrate 10, and patterned to create a lower layer of conductive paths 11.

Figure 5B:
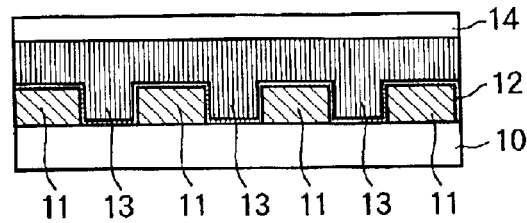

Next, as shown in FIG. 5b, a silicon dioxide ($SiO_2$) film 12 is formed on the semiconductor substrate 10 and conductive paths 11, in close contact therewith, and a layer of organic spin-on glass (spin-on glass) 13 is deposited on the $SiO_2$ film 12. The spin-on glass layer 13 is then planarized to create a flat surface on which an oxide cap 14 is formed.

Figure 5C:
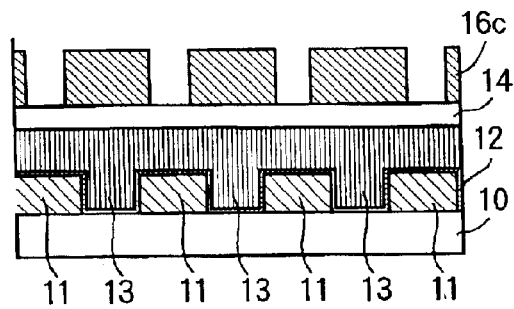

Next, as shown in FIG. 5C, the oxide cap 14 is coated with a photoresist 16c, and the photoresist 16c is patterned to define via holes.

Figure 5D:
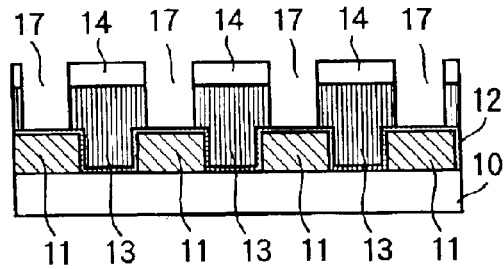

Next, as shown in FIG. 5D, the oxide cap 14, the layer of organic spin-on glass 13, and the $SiO_2$ film 12 are etched with the patterned photoresist 16c employed as a mask, thereby forming the via holes 17. After the via holes 17 have been formed, the photoresist 16c is removed.

Figure 5E:
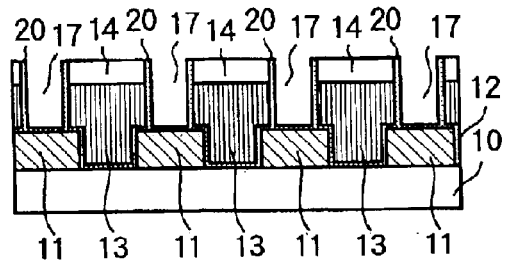

Next, as shown in FIG. 5E, a layer of barrier metal 20 for forming conductive plugs is deposited on the internal surfaces of the via holes 17.

Figure 5F:
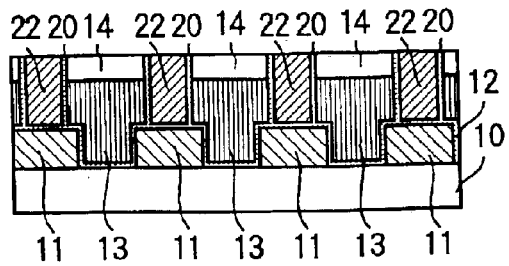

Next, as shown in FIG. 5F, the conductive plugs 22 are filled into the via holes 17.

Figure 5G:
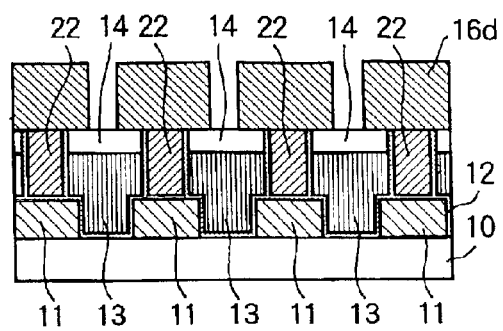

Next, as shown in FIG. 5G, the oxide cap 14 is coated with a photoresist 16d. The photoresist 16d is patterned to define pinholes.

Figure 5H:
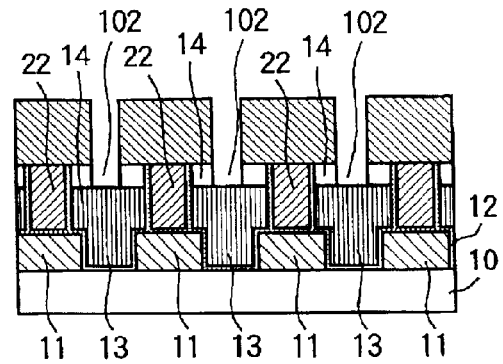

Next, as shown in FIG. 5H, the oxide cap 14 is etched with the patterned photoresist 16d employed as a mask, thereby forming the pinholes 102. The pinholes 102 form apertures exposing the upper surface of the organic spin-on glass 13, so that the organic spin-on glass 13 can be removed.

Figure 5I:
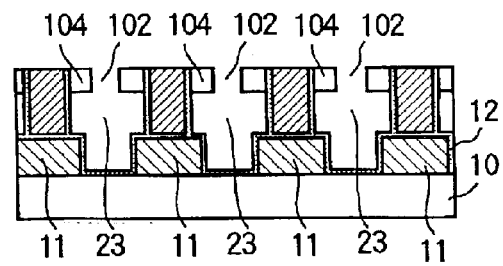

Next, as shown in FIG. 5I, the organic spin-on glass 13 is removed by etching through the pinholes 102, thereby forming cavities 23 in the spaces where the organic spin-on glass 13 was present. After the organic spin-on glass 13 has been removed, the photoresist 16d is removed.

Figure 5J:
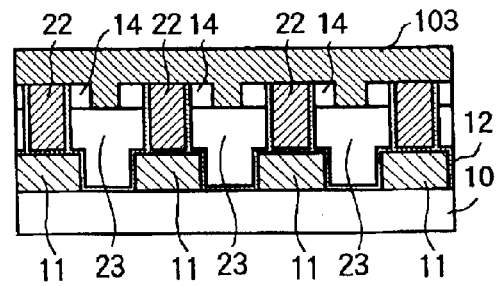

Next, as shown in FIG. 5J, an oxide film 103 is formed over the entire surface, covering the pinholes 102 formed in the oxide cap 14 and thereby trapping air (a material of low permittivity) within the cavities 23.

Figure 5K:
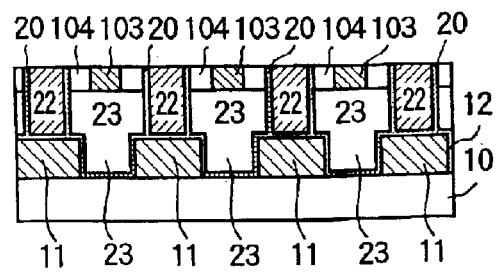

Next, as shown in FIG. 5K, the overlying oxide film 103 is chemically or mechanically removed to expose the conductive plugs 22.

Thereafter, an upper layer of conductive paths is formed on the conductive plugs 22 by the same process as in FIG. 5A. The entire series of processes in FIGS. 5A to 5K may be repeated one or more times to form multi-layer wiring.

In FIG. 5K, the low permittivity of the air trapped in the cavities 23 reduces the capacitive coupling between adjacent conductive paths 11 in the same wiring layer. When multi-layer wiring is formed, the air cavities also reduce the capacitive coupling between adjacent conductive paths in different wiring layers.

In the prior art described above, however, when the oxide film 103 is deposited to seal the pinholes 102 above the cavities 23, some oxide inevitably enters the cavities 23. An oxide residue becomes attached to the inside surfaces of the cavities 23, for example, and as noted above, the inadequately supported oxide material plugging the pinholes 102 in FIG. 5K may fall into the cavities 23. Even if only an oxide residue becomes attached to the inside surfaces of the cavities 23, the electric properties of the semiconductor device are affected. The oxide residue increases the capacitance (dielectricity) between adjacent conductive paths, so that the original purpose of forming the cavities 23, which was to reduce the capacitive coupling between adjacent conductive paths, is not fully achieved.

Both the first and second embodiments avoid this problem of oxide residue and debris in the cavities 23. The first and second embodiments also have the advantage of requiring fewer fabrication steps than does the prior art in FIGS. 5A to 5K. In the first embodiment in particular, the number of fabrication steps is greatly reduced. The type of organic spin-on glass that can be used is restricted in the first embodiment, but this restriction is removed in the second embodiment.

Third Embodiment

FIGS. 6A to 6H are sectional views of a semiconductor device at various stages of fabrication by a third method embodying the invention, using the same reference numerals as in FIGS. 1A to 1H for similar components and elements.

Figure 6A:
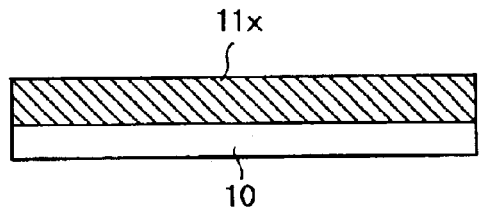
FIGS. 6A, 6B, 6C, 6D, 6E, 6F, 6G, and 6H are sectional views illustrating the fabrication of a semiconductor device by a third inventive method.
Figure 6B:
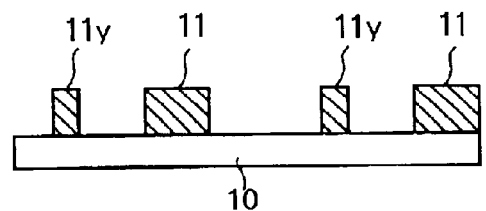

First, a conductive film 11x is formed on a semiconductor substrate 10 as shown in FIG. 6A, and patterned to create a lower layer of the conductive paths 11 and dummy paths 11y as shown in FIG. 6B. The dummy paths 11y are disposed where gaps 18 (shown in FIG. 6F) will be formed for the removal of organic spin-on glass 13. Each dummy path 11y is narrower than the corresponding gap.

Figure 6C:
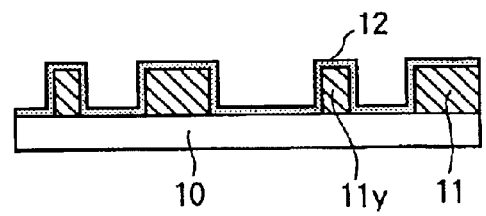
Figure 6D:
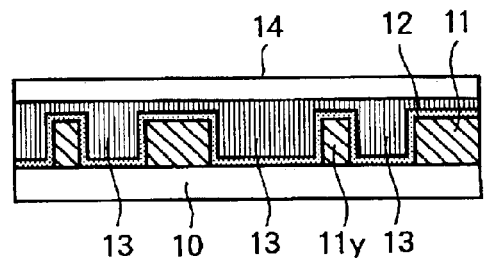
Figure 6E:
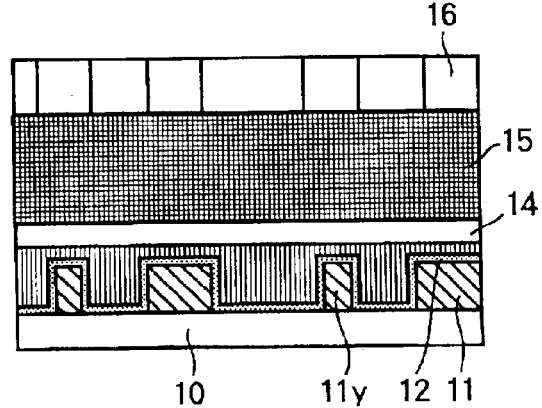

Next, as shown in FIG. 6C, an $SiO_2$ film 12 is formed on the semiconductor substrate 10, conductive paths 11, and dummy paths 11y, in close contact therewith, and a layer of organic spin-on glass 13 is deposited on the $SiO_2$ film 12, as shown in FIG. 6D. An oxide cap 14 is formed on the organic spin-on glass layer 13.

The subsequent processes shown in FIGS. 6D to 6H are identical to the corresponding processes in FIGS. 1D to 1H in the first embodiment. Detailed descriptions will be omitted.

Figure 6F:
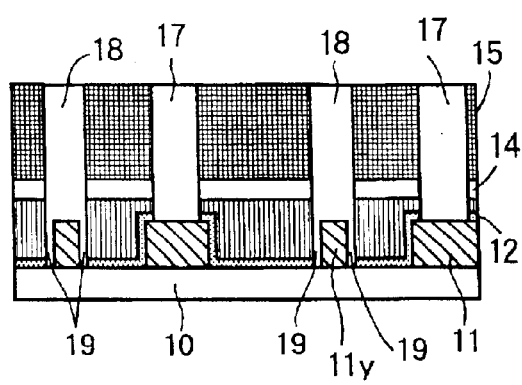
Figure 6G:
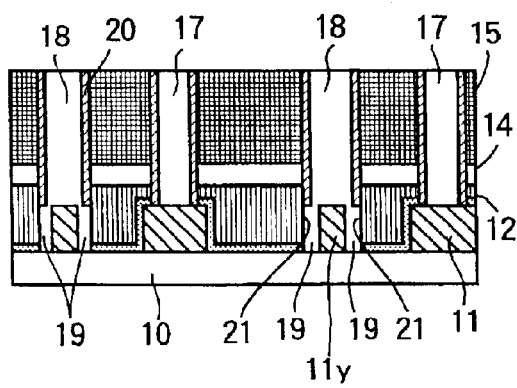
Figure 6H:
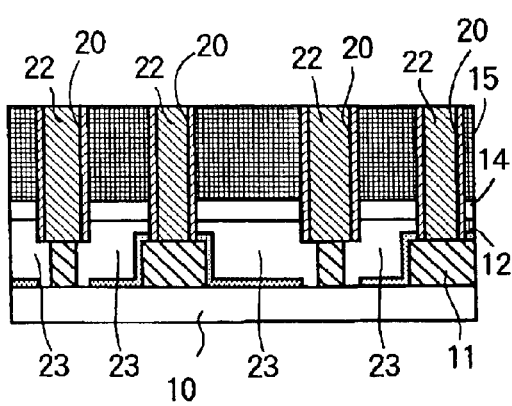

In the third embodiment, as shown in FIG. 6F, slits 19 are formed on both sides of the dummy paths 11y.

Figure 7:
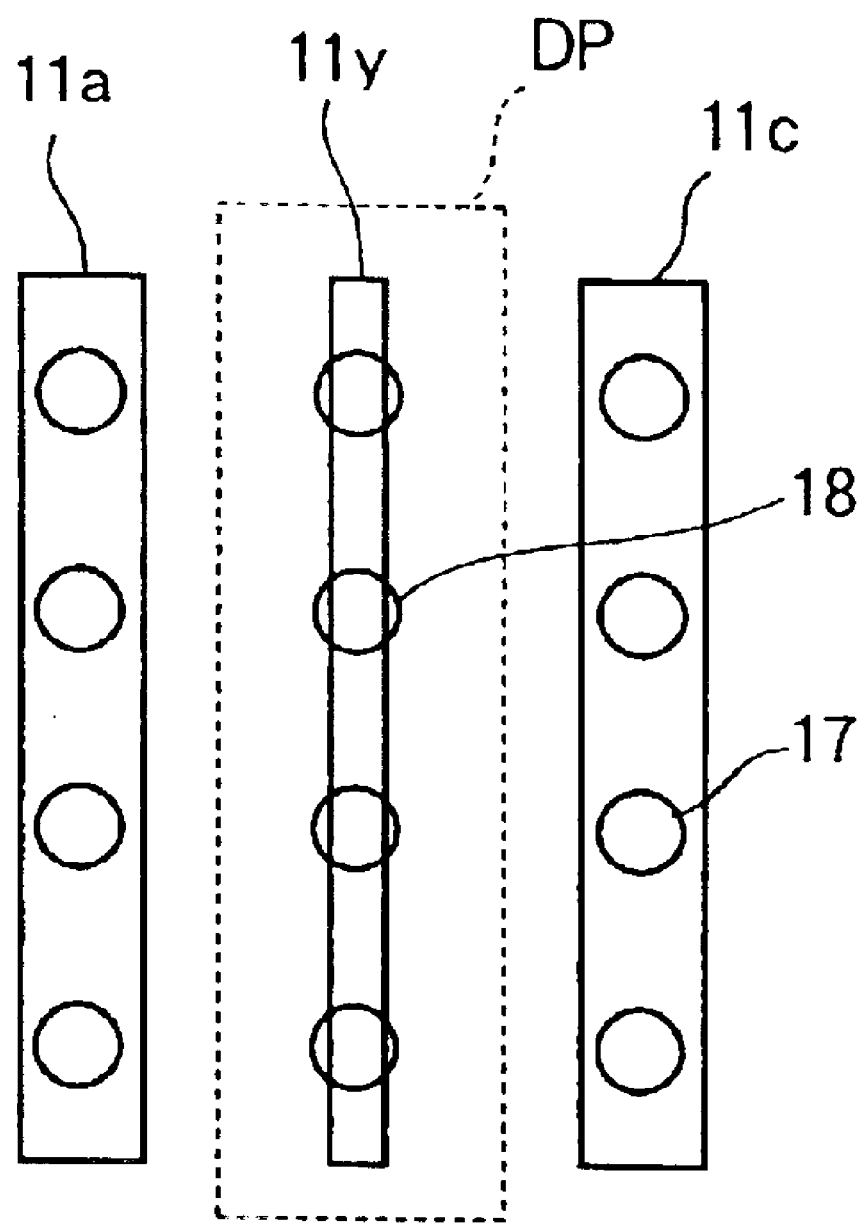
FIG. 7 illustrates a pattern of gaps for removing the spin-on glass in the third inventive method.

FIG. 7 shows a pattern of gaps 18 formed for removing the organic spin-on glass from various interlayer regions of a semiconductor device according to the third embodiment. The reference numerals in FIG. 7 correspond to the reference numerals in FIGS. 6A to 6H and FIGS. 2A to 2C, with the conductive paths 11a and 11c being disposed in the lower wiring layer, corresponding to the conductive paths 11 in FIGS. 6A to 6H. The gap pattern is denoted DP.

In the gap pattern illustrated in FIG. 7, among the adjacent paths 11a, 11y, and 11c, via holes 17 are formed only on the conductive paths 11a and 11c, and gaps 18 are formed only on the dummy path 11y, which is disposed between conductive paths 11a and 11c. The gaps 18 are circular and have a diameter greater than the width of the dummy path 11y. The gap pattern DP is thus oriented parallel to the routing direction of the conductive paths 11a, 11c and dummy path 11y. In the gap pattern DP, the gaps 18 are located so that they extend beyond both sides of the dummy path 11y. Slits 19 for removing the organic spin-on glass 13 (shown in FIG. 6F) are therefore created on both sides of the dummy path 11y.

As the gaps 18 for removing the organic spin-on glass 13 form slits 19 on both sides of the dummy path 11y, the slits 19 expose side faces 21 of the organic spin-on glass on both sides of the dummy path 11y. The exposed faces 21 are frontally exposed to the gas employed for formation of conductive plugs 22 ($WF_6$ gas is used to form tungsten conductive plugs 22 in the third embodiment). Organic spin-on glass 13 is efficiently removed from both sides of the dummy path 11y at once. Furthermore, since gaps 18 and via holes 17 do not alternate on each conductive path as they did in the first and second embodiments, the via holes 17 on each conductive path can be placed closer together than in the first and second embodiments. The third embodiment can therefore be applied to devices with finer geometries than can the first and second embodiments.

The third embodiment can be based on the second embodiment instead of the first embodiment.

The conductive plug material is not limited to tungsten, and the gas from which the conductive plugs are formed is not limited to tungsten hexafluoride.

Those skilled in the art will recognize that further embodiments and variations are possible within the scope of the appended claims.

What is claimed is:

1. A method of fabricating a semiconductor device, comprising:

forming a plurality of conductive paths, separated by spaces filled with organic spin-on glass, on a semiconductor substrate;

forming gaps in said spaces, the gaps separating the organic spin-on glass from the conductive paths, the gaps being narrower than the spaces in which the gaps are formed; and removing the organic spin-on glass through the gaps, after the gaps have been formed.

2. The method of claim 1, wherein said forming gaps further comprises exposing side faces of the organic spin-on glass, and said removing the organic spin-on glass further comprises removing the organic spin-on glass from the side faces.

3. The method of claim 1, further comprising forming a via hole for connecting one of the conductive paths to another conductive path in the semiconductor device, wherein the via hole and the gaps are formed simultaneously.

4. The method of claim 1, further comprising forming a via hole for connecting one of the conductive paths to another conductive path in the semiconductor device, wherein the via hole and the gaps are formed separately.

5. The method of claim 1, wherein the conductive paths are covered by an interlayer dielectric film, said forming the gaps further comprises:

forming openings in the interlayer dielectric film, the openings being misaligned with the conductive paths;

extending the openings to form slits beside the conductive paths; and coating internal surfaces of the openings with a barrier material, leaving internal surfaces of the slits uncoated, whereby side faces of the organic spin-on glass are left exposed in the slits.

6. The method of claim 5, wherein the slits have a width of 0.1–0.2 micrometer and the barrier material is titanium nitride.

7. The method of claim 1, wherein the conductive paths are covered by an interlayer dielectric film, the method further comprising:

forming via holes in the interlayer dielectric film; and filling the via holes with a conductive material making electrical contact with the conductive paths.

8. The method of claim 7, wherein the conductive paths include a first conductive path and a second conductive path, the first and second conductive paths being mutually adjacent, the first conductive path being adjacent at least one of the gaps and below none of the via holes, the second conductive path being adjacent none of the gaps and below at least one of the via holes.

9. The method of claim 8, wherein said forming the gaps comprises forming gaps on both sides of the first conductive path.

10. The method of claim 7, wherein the conductive paths include a first conductive path and a second conductive path, the first and second conductive paths being mutually adjacent, and the gaps alternate with the via holes on each of the first and second conductive paths.

11. The method of claim 10, wherein the gaps on the first conductive path face the via holes on the second conductive path, and the via holes on the first conductive path face the gaps on the second conductive path.

12. The method of claim 1, wherein said removing the organic spin-on glass further comprises etching the organic spin-on glass by exposure to a gas introduced through the gaps.

13. The method of claim 12, wherein the conductive paths are covered by an interlayer dielectric film, the method further comprising:

forming via holes in the interlayer dielectric film; and filling the via holes with conductive plugs making electrical contact with the conductive paths by introducing the gas into the via holes, the organic spin-on glass being etched while the conductive plugs are being formed.

14. The method of claim 13, wherein the conductive plugs are formed of tungsten and the gas comprises tungsten hexafluoride.

15. The method of claim 12, wherein the conductive paths are covered by an interlayer dielectric film, the method further comprising:

forming via holes in the interlayer dielectric film; and filling the via holes with a conductive material making electrical contact with the conductive paths, said filling being carried out separately from said removing of the organic spin-on glass.

16. The method of claim 15, wherein the gas comprises tungsten hexafluoride.

17. A method of fabricating a semiconductor device, comprising:

forming a plurality of conductive paths on a semiconductor substrate, the conductive paths being separated by organic spin-on glass and covered by an interlayer dielectric film;

forming openings in the interlayer dielectric film, the openings being misaligned with the conductive paths;

extending the openings to form slits beside the conductive paths;

coating internal surfaces of the openings with a barrier material, leaving internal surfaces of the slits uncoated, whereby side faces of the organic spin-on glass are left exposed in the slits; and removing the organic spin-on glass through the slits.

18. The method of claim 17, wherein the slits have a width of 0.1–0.2 micrometer and the barrier material is titanium nitride.

19. A method of fabricating a semiconductor device, comprising:

forming a plurality of conductive paths on a semiconductor substrate, the conductive paths being separated by organic spin-on glass and covered by an interlayer dielectric film;

forming gaps between the organic spin-on glass and the conductive paths;

removing the organic spin-on glass through the gaps by etching the organic spin-on glass by exposure to a gas introduced through the gaps;

forming via holes in the interlayer dielectric film; and filling the via holes with conductive plugs making electrical contact with the conductive paths by introducing the gas into the via holes, the organic spin-on glass being etched while the conductive plugs are being formed.

20. The method of claim 19, wherein the conductive plugs are formed of tungsten and the gas comprises tungsten hexafluoride.

21. A method of fabricating a semiconductor device, comprising:

forming a plurality of conductive paths on a semiconductor substrate, the conductive paths being separated by organic spin-on glass and covered by an interlayer dielectric film;

forming gaps between the organic spin-on glass and the conductive paths;

removing the organic spin-on glass through the gaps by etching the organic spin-on glass by exposure to a gas introduced through the gaps, the glass including tungsten hexafluoride;

forming via holes in the interlayer dielectric film; and filling the via holes with a conductive material making electrical contact with the conductive paths, said filling being carried out separately from said removing of the organic spin-on glass.

* * * * *